United States Patent
Glavan et al.

(10) Patent No.: US 10,672,637 B2
(45) Date of Patent: Jun. 2, 2020

(54) INTERNAL PURGE DIFFUSER WITH OFFSET MANIFOLD

(71) Applicant: Entegris, Inc., Billerica, MA (US)

(72) Inventors: Kyle Glavan, Castle Rock, CO (US); Jeffery J. King, Colorado Springs, CO (US); Matthew Fuller, Colorado Springs, CO (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/755,357

(22) PCT Filed: Sep. 2, 2016

(86) PCT No.: PCT/US2016/050085
§ 371 (c)(1),
(2) Date: Feb. 26, 2018

(87) PCT Pub. No.: WO2017/040913
PCT Pub. Date: Mar. 9, 2017

(65) Prior Publication Data
US 2018/0247849 A1    Aug. 30, 2018

Related U.S. Application Data

(60) Provisional application No. 62/214,464, filed on Sep. 4, 2015, provisional application No. 62/263,194, filed on Dec. 4, 2015.

(51) Int. Cl.
*H01L 21/673*      (2006.01)

(52) U.S. Cl.
CPC .. *H01L 21/67393* (2013.01); *H01L 21/67376* (2013.01); *H01L 21/67379* (2013.01)

(58) Field of Classification Search
CPC ........ B65D 51/00; B65D 51/16; B65D 85/30; H01L 21/00; H01L 21/02; H01L 21/67;
(Continued)

(56) References Cited

U.S. PATENT DOCUMENTS 5,879,458 A * 3/1999 Roberson, Jr. .... H01L 21/67017
                                                            206/710
6,221,163 B1    4/2001 Roberson, Jr.
(Continued)

FOREIGN PATENT DOCUMENTS

| | | |
|---|---|---|
| JP | 2013513951 A | 4/2013 |
| WO | 20110722602 A2 | 6/2011 |
| WO | 2015/057739 A1 | 4/2015 |

*Primary Examiner* — Bryon P Gehman
(74) *Attorney, Agent, or Firm* — Entegris, Inc.

(57) ABSTRACT

A purge tower assembly for a substrate container. The assembly may include a purge interface body, including a base portion and a top portion, for mounting to a bottom plate of a substrate container. The base portion may include a substantially tubular base sidewall and the top portion may have a top sidewall positioned on the top edge of the base portion. The top portion may include an inlet nozzle for mounting through a rearward inlet in the bottom plate. The inlet nozzle may have a substantially tubular sidewall extending upwardly from the top sidewall and defining an interior of the inlet nozzle. The base portion and the top sidewall may define an offset conduit portion disposed connected to the base portion and the inlet nozzle, the base portion and the inlet nozzle in fluid communication via the offset conduit portion.

20 Claims, 15 Drawing Sheets

(58) Field of Classification Search
CPC ............. H01L 21/673; H01L 21/67326; H01L 21/67379; H01L 21/67393; H01L 21/677; H01L 21/302
USPC .......................................... 206/454, 710, 711
See application file for complete search history.

(56) References Cited

U.S. PATENT DOCUMENTS

| | | |
|---|---|---|
| RE39,241 E | 8/2006 | Fosnight |
| 7,201,276 B2 * | 4/2007 | Burns ............... H01L 21/67369 206/710 |
| 8,783,463 B2 | 7/2014 | Watson |
| 9,054,144 B2 | 6/2015 | Burns et al. |
| 9,543,177 B2 * | 1/2017 | Miyajima ......... H01L 21/67772 |
| 10,347,517 B2 * | 7/2019 | Smith ............... H01L 21/67393 |
| 2005/0115866 A1 | 6/2005 | Burns et al. |
| 2016/0276190 A1 * | 9/2016 | Smith ............... H01L 21/67393 |

\* cited by examiner

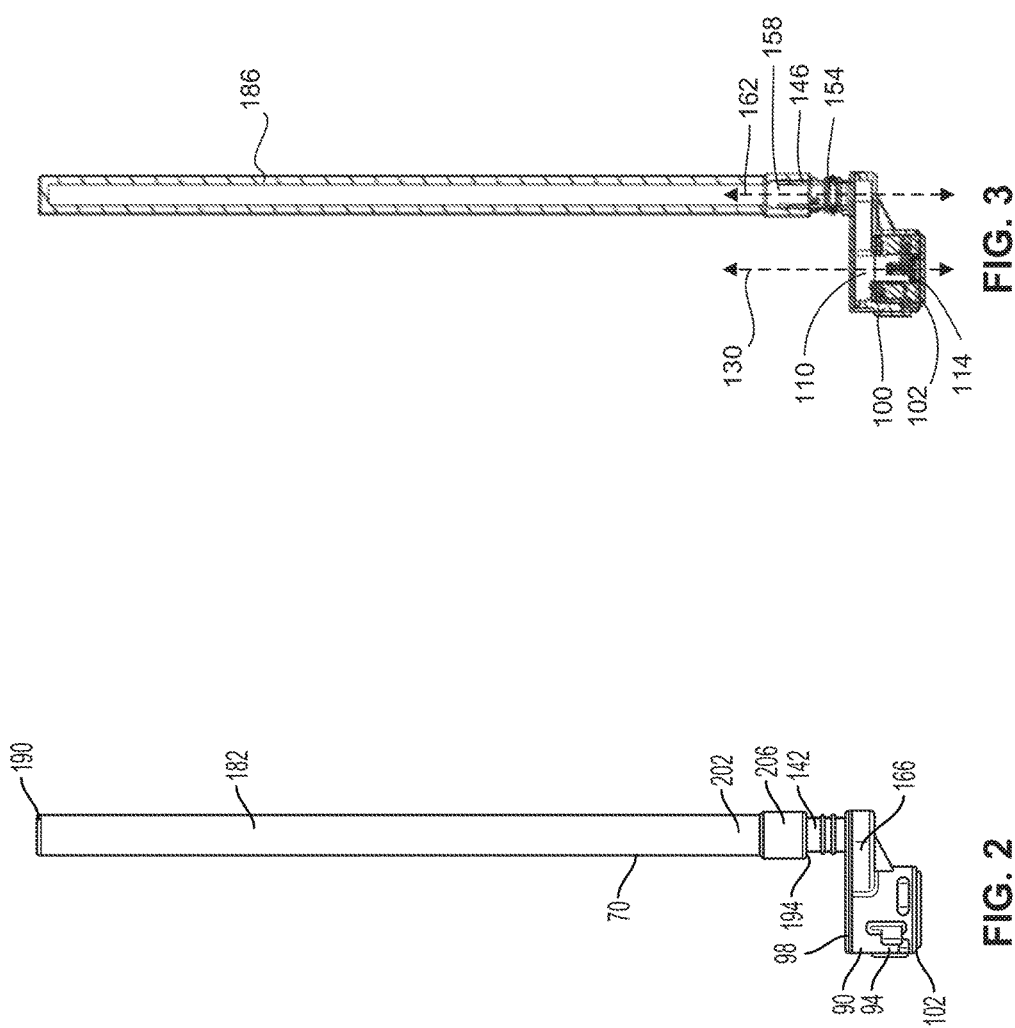

INTERNAL PURGE DIFFUSER WITH OFFSET MANIFOLD

RELATED APPLICATIONS

This application is a U.S. national phase under the provisions of 35 U.S.C. § 371 of International Patent Application No. PCT/US2016/050085 filed Sep. 2, 2016, which in turn claims the benefit of the earlier filing date of U.S. Patent Application No. 62/214,464, filed on Sep. 4, 2015 and U.S. Patent Application No. 62/263,194, filed on Dec. 4, 2015, the contents of which are incorporated herein by reference, in their respective entireties, for all purposes.

FIELD OF THE DISCLOSURE

The disclosure is directed generally to purge systems for micro-environments, and more specifically to diffuser towers for substrate containers.

BACKGROUND

During insertion or removal of substrates from a substrate container, traces of dust, gaseous impurities, or increased humidity can be introduced into the substrate container, adversely affecting product yield of the resident wafers. Accordingly, there is an increased demand for controlling the environment within these containers during substrate handling to achieve or maintain a high level of cleanliness.

A microenvironment within a substrate container is, in some instances, purged using an inert gas that is injected into the interior of the container through an inlet port causing the air within the container to exit through an outlet port. Systems and methods of delivering purge gas into the container have been designed to provide an improved environment within the container.

As front opening unified pods (FOUPs) were developed, bottom purge ports were introduced by carrier manufacturers to enable the purging of the interior environment with clean dry air (CDA) or inert purge. These purge modules were introduced below the internal bottom surface of the FOUP shell.

When purge diffusers were introduced, it became apparent that if the diffuser was assembled axially to the purge interface it would not only interfere with the wafer handling exclusion volume but also the wafers stored inside of the FOUP. Instead, without making any modifications to the existing shell design, the diffuser tube was designed to be internally offset axially.

U.S. Pat. No. 9,054,144 to Burns et al. ("Burns") discloses a substrate container with a purge tower that includes a base portion and a diffuser tower portion connected by an offset conduit. The offset conduit enables the tower portion to be offset toward the back of the container, thereby enabling the interior space to be better utilized for substrate storage and handling and provided a more compact design. The disclosure of Burns is hereby incorporated by reference herein except for express definitions and patent claims contained therein.

SUMMARY

Conventional purge towers that utilize an offset conduit are configured so that the offset conduit is inside the substrate container and projected upward from the floor of the substrate container such that the offset conduit portion is not flush with the floor. While the conduit can be sized so that the lowermost wafer passes over the conduit, it has been found that the protruding conduit can still interfere with the operation of robotic end effectors during insertion or removal of the lowermost wafer. The interference can cause collisions between the end effector and the conduit, thereby generating particles and can also lead to wafer mishandling.

Another issue with conventional offset purge towers is that they must be mounted to the interior of the substrate container. For configurations where the overall length of the offset purge tower is greater than the floor-to-ceiling clearance of the substrate container, problems can arise when trying to upright the purge tower during assembly. The upper extremity of the diffuser portion may collide with the ceiling of the substrate container, which may damage one or both of the diffuser portion and the substrate container. In some instances, the desired length of the diffuser portion may need to be compromised.

Various embodiments of the present disclosure are directed to a purge diffuser assembly that frees up additional space within the wafer container for wafer storage and manipulation, while allowing for the flow of purge gas. Accordingly, various embodiments of the disclosure present a lower probability of contaminating the interior surfaces of the substrate container due to collisions between the end effector and the purge tower assembly. Furthermore, in various embodiments of the disclosure, the effective length of the diffuser portion of the purge tower assembly is increased such that purge gas outlets are located closer to the floor of the substrate container than with conventional purge tower assemblies. By locating purge outlets closer to the floor, the flow of purge gas beneath the lowermost wafer of the substrate container can be increased for improved purge performance.

Various embodiments of the disclosure provide an offset conduit that is external to the substrate container instead of being internal to the container, the conduit being routed underneath the floor of the substrate container. The additional space provided by locating the offset conduit external to the substrate container enables robotic end effectors to maneuver beneath a lowermost wafer stored therein without colliding with the offset conduit.

Also, some embodiments are configured so that the diffuser portion of the purge tower may be active at the floor level of the substrate container. That is, the effective length of the diffuser portion begins at a height on the diffuser portion that corresponds with the floor of the substrate container. This enables purge gas to enter the substrate container at floor level, so that purge flow beneath the lowermost substrate is increased relative to conventional purge towers. In one embodiment, the effective portion of the diffuser portion is lowered by as much as 4.5 mm relative to conventional diffusers.

Some embodiments of the disclosure present an externally offset purge tower assembly that is assembled externally and can be mounted and dismounted from the exterior of the substrate container. Some embodiments of the disclosure include a diffuser portion that is detachable and re-attachable to a purge interface body of the externally offset purge tower assembly, so that the diffuser portion is affixed to the purge interface body after the purge interface body is mounted to the substrate container. Through both of these embodiments, the problem of excessive length of the purge tower assembly is eliminated.

Also contemplated are embodiments that reduce the profile of an internal conduit by providing a recess in the floor of the container through which the conduit is routed. The offset conduit and recess may be sized so that the uppermost extremity of the offset conduit is at or below the interior level of the floor of the substrate container. In such an embodiment, reduced profile of the offset conduit, though internal, provides the same effect as an external offset conduit with respect to end effector clearance and enhances purging of the lowermost substrate.

Various embodiments of the disclosure are directed to a purge tower assembly for a substrate container that includes a purge interface body for connection to a bottom plate of a substrate container. The purge interface body may include a base portion and a top portion. The base portion may have a substantially tubular base sidewall extending upwardly from a bottom edge to a top edge. The bottom edge may define a first aperture, concentric about a first axis, for access to an interior of the base portion.

In one or more embodiments the top portion is connected to the top edge of the base portion. The top portion may have a top sidewall positioned on the top edge of the base portion for upwardly covering the bottom aperture. The top portion may include an inlet nozzle for mounting through an inlet in the bottom plate of the substrate container. The inlet nozzle may have a substantially tubular nozzle sidewall extending upwardly from the top sidewall to a nozzle edge. The nozzle edge may define a second aperture, concentric about a second axis, for access to an interior of the inlet nozzle. In certain embodiments, the second axis is substantially parallel to and positioned rearward of the first axis. In one or more embodiments, the purge interface body includes an offset conduit portion disposed between the base portion and the inlet nozzle. The base portion and the inlet nozzle may be in fluid communication via the offset conduit portion.

The purge tower assembly includes a diffuser portion. In one or more embodiments, the diffuser portion is a diffuser portion including a porous diffuser sidewall and defining a diffuser passageway that extends into the diffuser portion along a diffuser axis. The diffuser sidewall may define an opening at a bottom portion of the diffuser portion that may be operatively coupled to the inlet nozzle for fluid communication between the base portion, the inlet nozzle, and the diffuser portion. Additionally or alternatively, the diffuser portion may comprise an exterior shell with a plurality of through apertures formed therein.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 2 is a front elevational view of a purge tower assembly, according to an embodiment of the disclosure.

FIG. 3 is a cross-sectional view of the purge tower assembly of FIG. 2, according to an embodiment of the disclosure.

Figure 1:
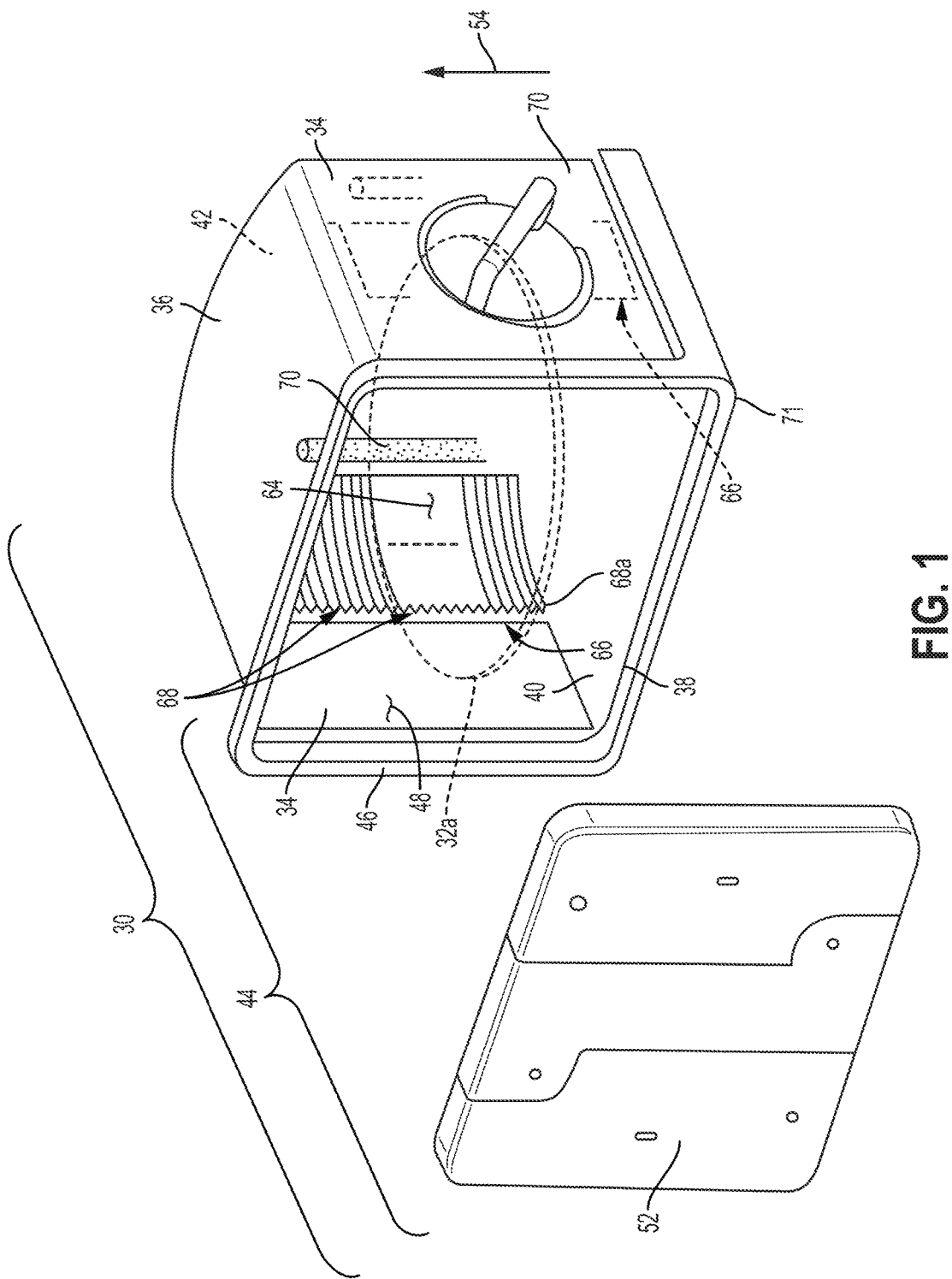
FIG. 1 is a perspective view of a substrate container, according to an embodiment of the disclosure.

While embodiments of the disclosure are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Referring to FIG. 1, a substrate container 30 for storing a plurality of substrates is depicted, according to an embodiment of the disclosure. As used herein, the plurality of substrates include substrates used in the manufacture of semiconductors, printed circuit boards, flat panel displays, and/or the like. For purposes of illustration, a single substrate 32*a* is presented. In certain embodiments, the substrate container 30 includes two opposing side portions 34, a top portion 36, a bottom plate 38 and a back portion 42. The bottom plate 38 defines an interior surface or floor 40 for the substrate container 30. A front portion 44 of the substrate container 30 includes a door frame 46 that defines a door opening 48 for insertion and removal of substrates 32. A door 52 is adapted to seal and cover the door opening 48. The door opening 48 of the substrate container 30 lies in a plane that is substantially parallel to a vertical direction 54. In various embodiments, the substrate container 30 is characterized as containing a microenvironment 64.

In one or more embodiments, a pair of slotted sidewalls 66 are disposed within the substrate container 30, each being proximate a respective one of the side portions 34. The slotted sidewalls 66 are aligned so that the slots face each other to define a plurality of slot positions 68, and are spaced apart so that the substrate(s) 32 are supported therebetween. For purposes of this disclosure, a lowermost slot position 68a (i.e., the slot closest to the bottom plate 38) of the plurality of slot positions 68 is identified as the "first" slot, with the slot numbers increasing in the upward direction. For purposes of illustration, such as in FIGS. 6-8 and 15-16, described below, a substrate 32b is presented, and is depicted as occupying the lowermost slot 68a.

In various embodiments, the substrate container 30 further includes at least one purge tower assembly 70 disposed within the substrate container 30. In various embodiments, the purge tower assembly 70 may be operatively coupled to a gas source (not depicted) external to the substrate container 30 for introduction of a gaseous working fluid into the substrate container 30. In certain embodiments, one or more of the purge tower assemblies 70 are oriented to direct the gaseous working fluid toward the door opening 48 in order to purge the substrate container 30.

In certain embodiments, the substrate container 30 further includes a conveyor plate 71 positioned below the bottom plate 38. In various embodiments, the conveyor plate 71 is mounted to the bottom of the substrate container 30 for machine based positioning and alignment of the substrate container 30 during various substrate processing steps.

Referring to FIGS. 2-5, a purge tower assembly 70 is depicted, according to an embodiment of the disclosure. In the depicted embodiment, the purge tower assembly 70 includes a purge interface body 90 including a base portion 94 and a top portion 98. In one or more embodiments, the purge interface body 90 is appropriately sized and shaped for mounting externally on a substrate container 30. For example, the purge interface body may be mounted to a conveyor plate 71 of a substrate container 30. In some embodiments, the purge interface body may be mounted to the bottom plate 38. In some embodiments, the purge interface body 90 may be mounted between the bottom plate 38 and a conveyor plate 71.

Figure 4:
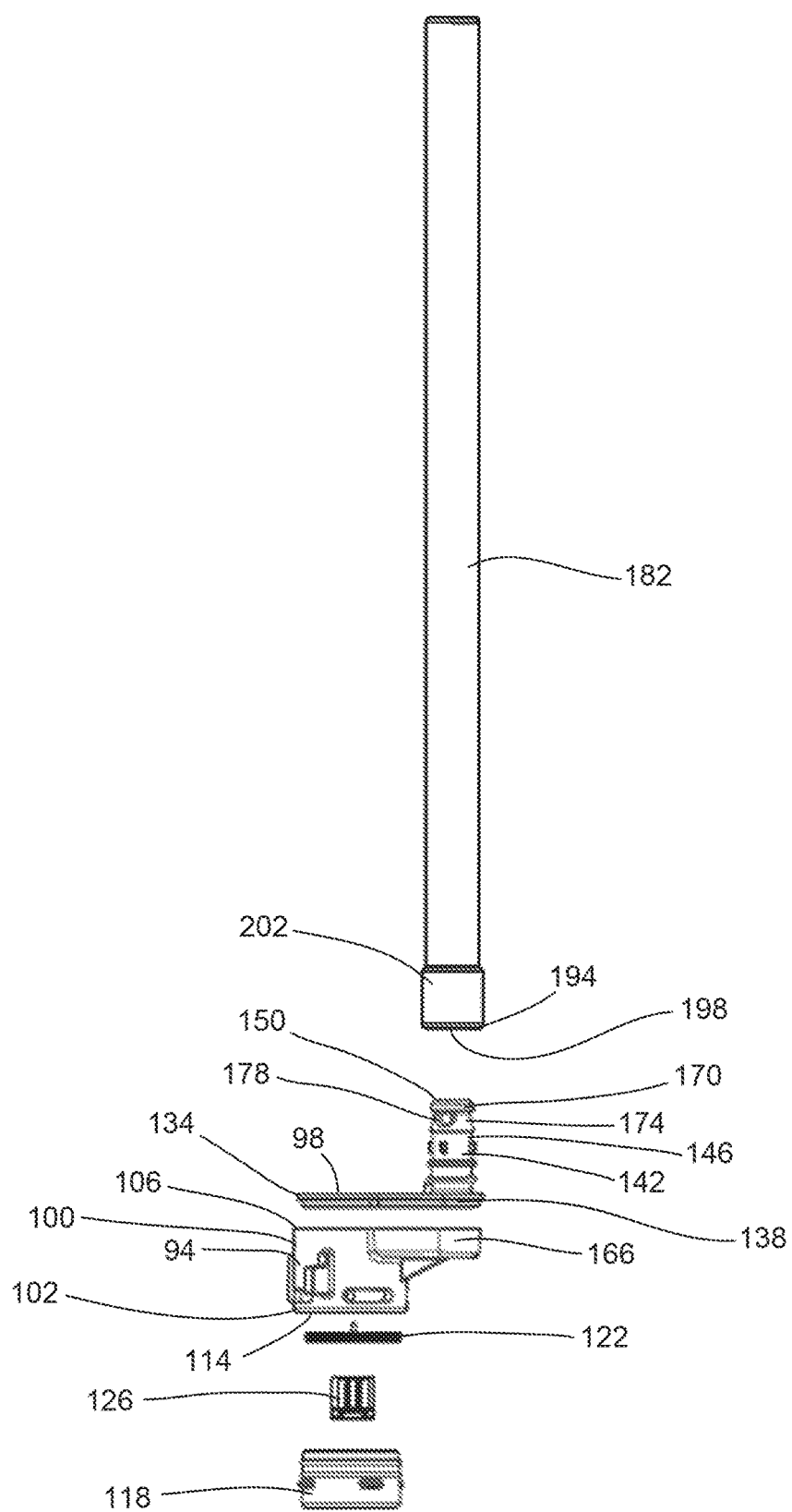
FIG. 4 is an exploded view of the purge tower assembly of FIG. 4, according to an embodiment of the disclosure.

In various embodiments, for example in FIG. 3, the base portion 94 has tubular shape defined by a sidewall 100 that extends from a bottom edge 102 to a top edge 106. The tubular shape of the sidewall 100 defines an interior portion 110 and, at the bottom edge 102, defines a bottom aperture 114 for access into the interior portion 110. In various embodiments, the base portion 94 includes components for coupling to an outside fluid source. For example, in some embodiments, the base portion includes a grommet 118, filter 122, and a valve 126 mounted in the bottom aperture 114 and in the interior portion 110 (FIG. 4). In certain embodiments, the bottom aperture 114 is concentric with an axis 130.

Figure 5:
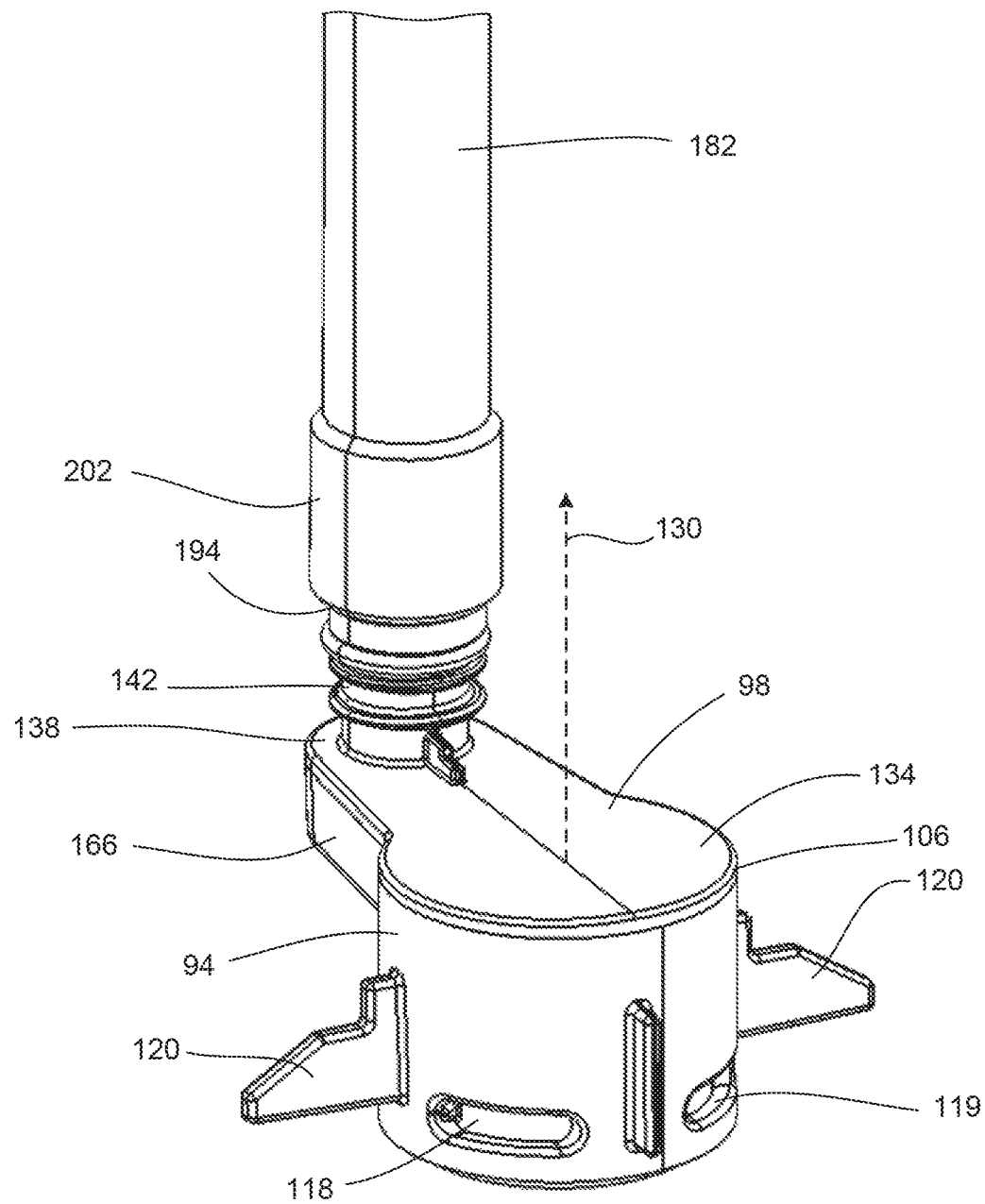
FIG. 5 is an enlarged, partial perspective view of a purge tower assembly, according to an embodiment of the disclosure.

In one or more embodiments, for example in FIG. 5, the sidewall 100 defines a plurality of apertures 119 in the base portion 94. In certain embodiments, each of the apertures 119 are spaced circumferentially about the sidewall 100 and about the axis 130. In various embodiments, the apertures 119 are receptacles for lugs protruding from the side of the grommet 118 for fitting and placement of the grommet 118 within the interior 110 of the base portion 94. For example, in some embodiments, the grommet 118 is a flexible component and lugs may elastically compressing during insertion into the interior 110 of the base portion and then expand outwardly into apertures 119 to lock the grommet in place.

In some embodiments, the base portion 94 includes support portions 120. The support portions 120 may be outwardly extending portions of material integral with the sidewall 100. In certain embodiments, the support portions 120 function as handles or grips for manipulation of the purge interface body 90. In some embodiments, the support portions 120 are flexible beams that snap fit into undercut features in the conveyor plate for installation of the body 90 to a substrate container, described further herein.

In one or more embodiments, the top portion 98 includes a top sidewall 134 that is substantially planar and connected to the base portion 94 along the top edge 106. In some embodiments, the top sidewall 134 is connected to the top of the base portion 94. The base portion 94 and the top portion 98 may be connected by techniques available to the artisan, for example, ultrasonic or heat welding, snap fits, adhesive bonding, or by other suitable techniques.

Additionally, for example in FIG. 3, the top sidewall 134 may include an offset portion 138 extending to one side from the base portion 94. The offset portion 138 may include an inlet nozzle 142 offset from the base portion 94. In one or more embodiments, the inlet nozzle 142 has a tubular shape defined by a nozzle sidewall 146 extending upwardly from the top sidewall 134 to a nozzle edge 150. In one or more embodiments, the nozzle sidewall 146 defines an interior portion 154 and a nozzle aperture 158 at the nozzle edge 150. In various embodiments, the nozzle aperture 158 provides access to the interior portion 154 of the inlet nozzle 142. In certain embodiments, the nozzle aperture 158 is concentric about a second axis 162. In various embodiments, the second axis 162 is substantially parallel to the first axis 130.

In one or more embodiments, an offset conduit portion 166 is disposed between the base portion 94 and the inlet nozzle 142 (FIGS. 2 and 5). In one or more embodiments, the offset conduit portion 166 cooperates with the offset portion 138 of the top sidewall 134 to provide a passage between the base portion 94 and the inlet nozzle 142 for fluid communication between the components of the purge interface body 90.

In operation, fluid enters the purge tower assembly 70 through the check valve 126 and the bottom aperture 114, passing through the interior portions 110, 154 and through the nozzle aperture 158. Functionally, the offset conduit 166 diverts flow from the first axis 130 to the second axis 162.

In some embodiments, as shown in FIG. 5, the inlet nozzle 142 is a barbed nozzle including a barbed portion 170 and a tapered portion 174 of the nozzle sidewall 146. In certain embodiments, the barbed portion 170 defines an outer diameter of the inlet nozzle 142 and the tapered portion 174 defines a reduced outer diameter adjacent the barbed portion 170. In certain embodiments, the nozzle sidewall 146 defines a lateral aperture 178 between the barbed portion 170 and the tapered portion 174. Described further, the lateral aperture 178 is a hole or aperture in the nozzle sidewall 146 for low diffusion of gas into the substrate container 30.

In one or more embodiments, the purge tower assembly 70 includes a diffuser portion 182 coupled to the inlet nozzle 142 of the purge interface body 90. In some embodiments, the diffuser portion 182 includes a porous or perforated (apertured) sidewall 186. In some embodiments, the sidewall 186 defines a substantially tubular shape with a diffuser passageway that extends from a top face 190 of the diffuser portion 182 to a bottom edge 194. In one or more embodiments, the bottom edge 194 of the diffuser portion 182 defines an aperture 198 at a bottom portion 202 of the diffuser portion 182. In various embodiments, the aperture 198 may be sized for insertion of the inlet nozzle 142 for operative coupling between the two for fluid communication between the base portion 94, the inlet nozzle 142, and the diffuser portion 182.

In certain embodiments, the nozzle sidewall 186 includes external threads formed on an external surface of the nozzle sidewall 146 (not depicted). The diffuser portion 182 may include internal threads formed on an internal surface of the diffuser portion (not depicted). The threads of the diffuser portion 182 and the nozzle sidewall 186, when implemented, are compatible for coupling therebetween.

In various embodiments, the diffuser portion 182 includes a widened portion 206 at the bottom portion of the diffuser portion 182. In certain embodiments, the widened portion 206 is widened outwardly, having an increased inner diameter relative to the main body of the diffuser portion for insertion and coupling with the inlet nozzle 146.

Figure 6:
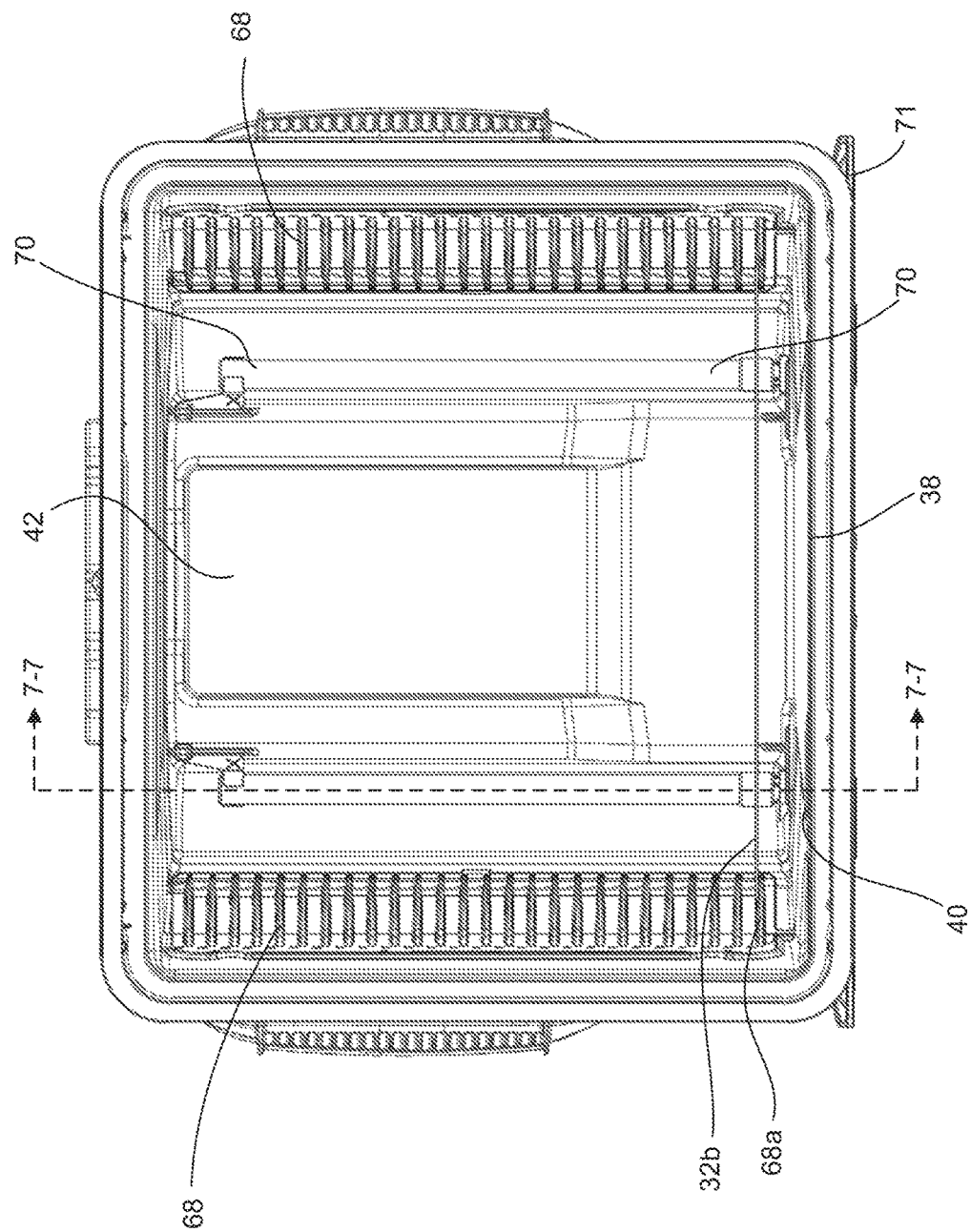
FIG. 6 is a front elevational view of purge tower assemblies mounted in a substrate container, according to an embodiment of the disclosure.
Figure 7:
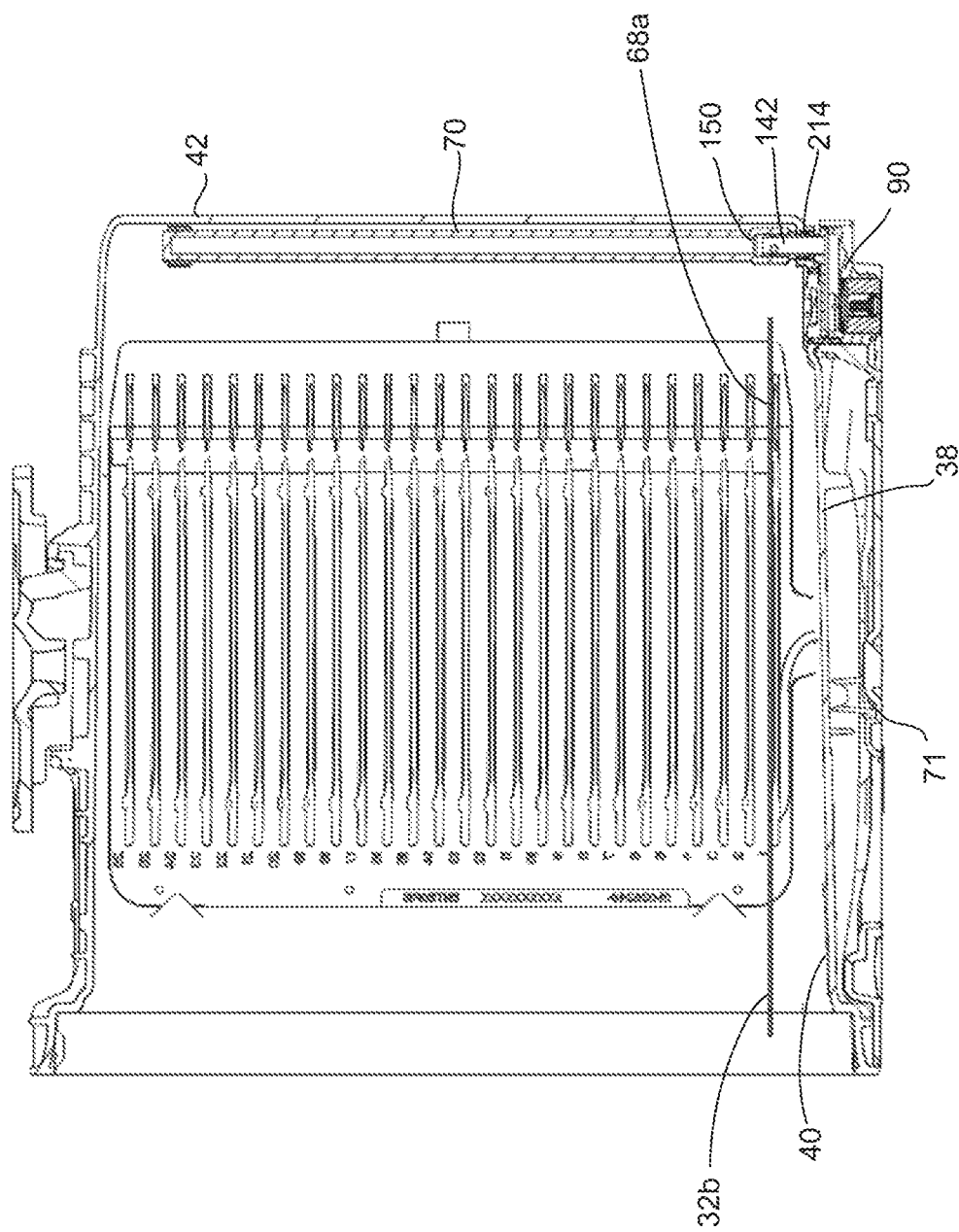
FIG. 7 is a cross-sectional view of the purge tower assembly and substrate container taken at line 7-7 of FIG. 6.
Figure 8:
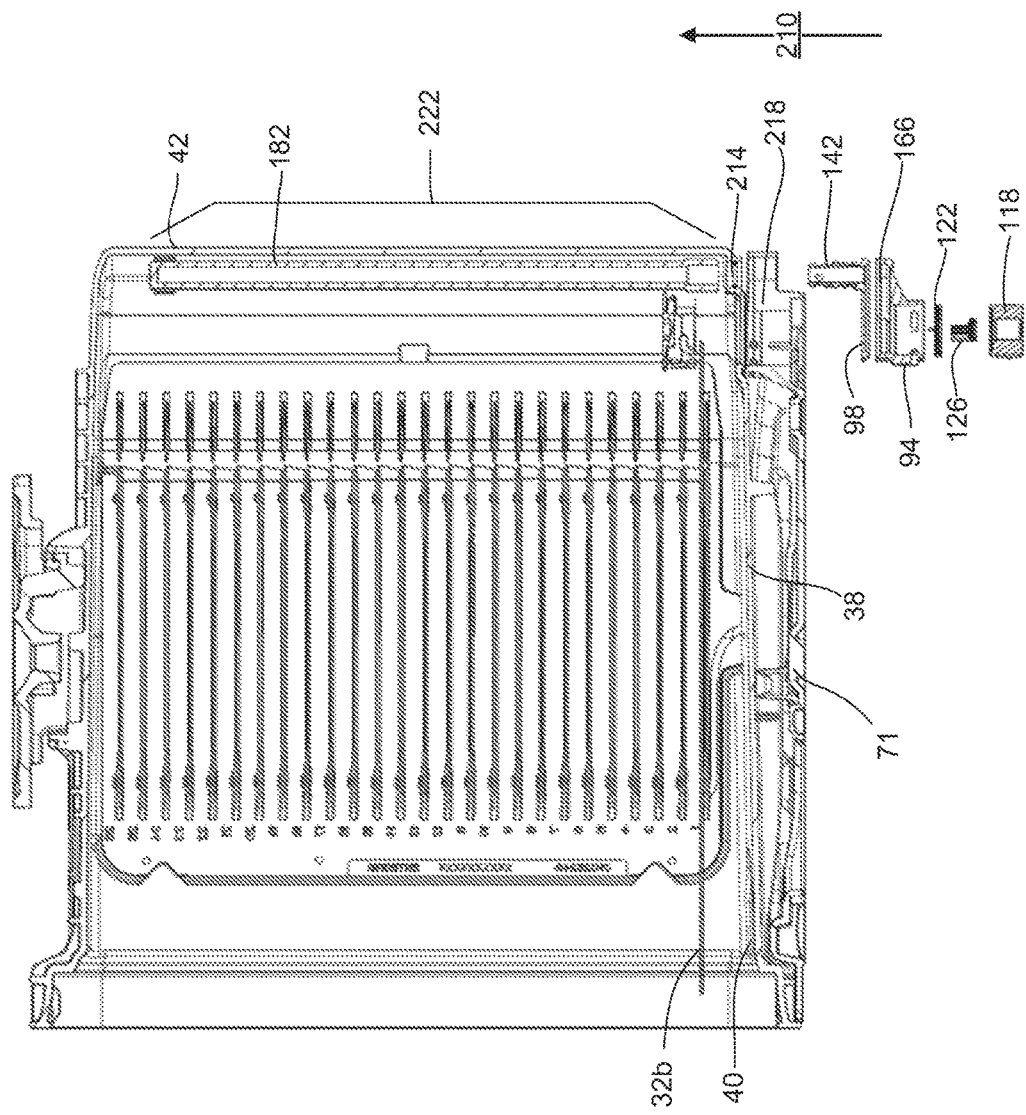
FIG. 8 is a cross-sectional view of a substrate container and an exploded view of a purge tower assembly, according to an embodiment of the disclosure.
Figure 9:
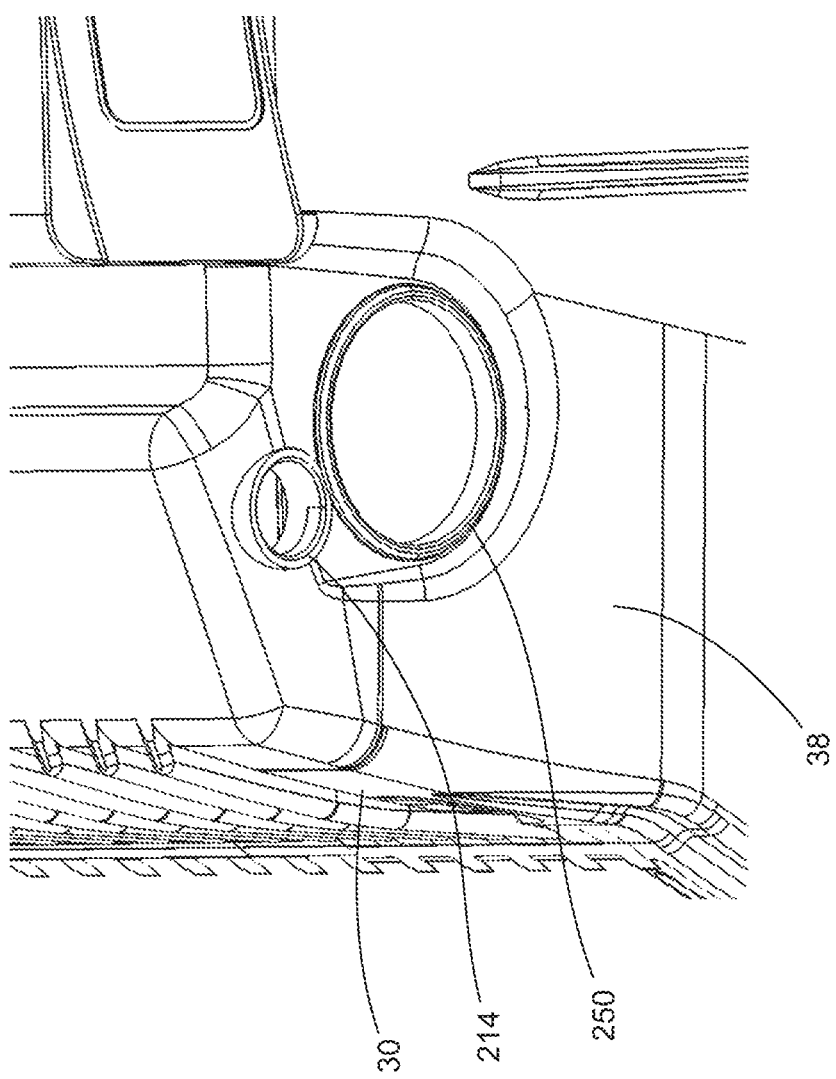
FIG. 9 is a partial bottom perspective view of a substrate container including openings for a purge tower assembly, according to an embodiment of the disclosure.

Referring to FIGS. 6-8, the purge tower assembly 70 is depicted in assembly in the substrate container 30 according to an embodiment of the disclosure. In the depicted embodiment, the substrate container 30 and the purge tower assembly 70 are the same or substantially similar as described herein. Accordingly, like elements are identified with like-numbered reference numerals.

In assembly, for example in FIG. 8, the purge interface body 90 may be assembled to the substrate container 30 by inserting the purge interface body 90 upwardly in direction 210, placing inlet nozzle 142 through a rearward inlet 214 in the bottom plate 38 and attaching the purge interface body 90 to an exterior surface of the bottom plate 38 in a rearward mounting region 218. In various embodiments, the rearward mounting region 218 is between the conveyor plate 71 and the bottom plate 38. The purge interface body 90 can be designed to assemble to the substrate container 30 to various vertical heights 222 relative to a purge fixture of a load port. In various embodiments, the vertical height 222 substantially matches the vertical height of existing substrate container(s). In one or more embodiments, the inlet nozzle 142 is sized such that, when mounted to the conveyor plate 71 of the substrate container 30, the nozzle edge 150 of the inlet nozzle 142 extends upwardly to about the first slot 68a of the substrate container 30.

Once the purge interface body 90 is inserted through the inlet 214, the diffuser portion 182 may be assembled thereto by accessing the inlet nozzle 142 at the rear of the substrate container 30 via the door opening 48. The diffuser portion 182 is then affixed to the inlet nozzle 142.

Referring to FIGS. 9-14, various stages of assembly of the purge tower assembly 70 within substrate container 30 are depicted according to an embodiment of the disclosure. The substrate container 30 and the purge tower assembly 70 may be the same or substantially similar as described herein. Accordingly, like elements are identified with like-numbered reference numerals. In reference to FIG. 9, a bottom perspective view of a substrate container 30 and bottom plate 38 are depicted. In one or more embodiments, the bottom plate 38 includes a rearward inlet 214 for insertion of an inlet nozzle 142 of a purge tower assembly 70 (FIG. 8). Additionally, in some embodiments, the bottom plate 38 includes a mounting inlet 250. In various embodiments, the mounting inlet 250 is an aperture in the bottom plate 38 for receiving mounting means for mounting the conveyor plate 71 to the bottom plate 38 of the substrate container 30.

Figure 10:
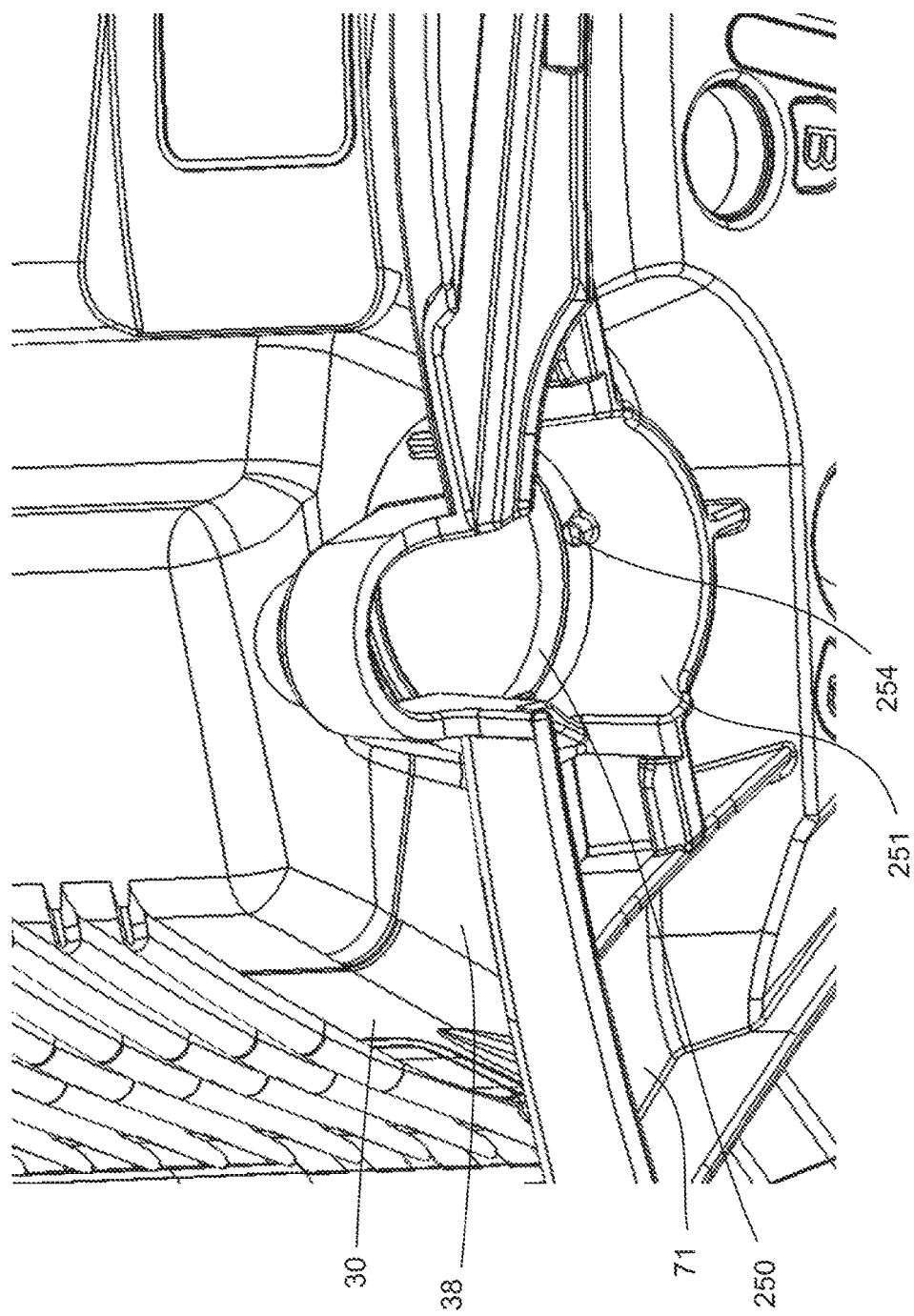
FIG. 10 is a partial bottom perspective view of a substrate container including a conveyor plate, according to an embodiment of the disclosure.
Figure 11:
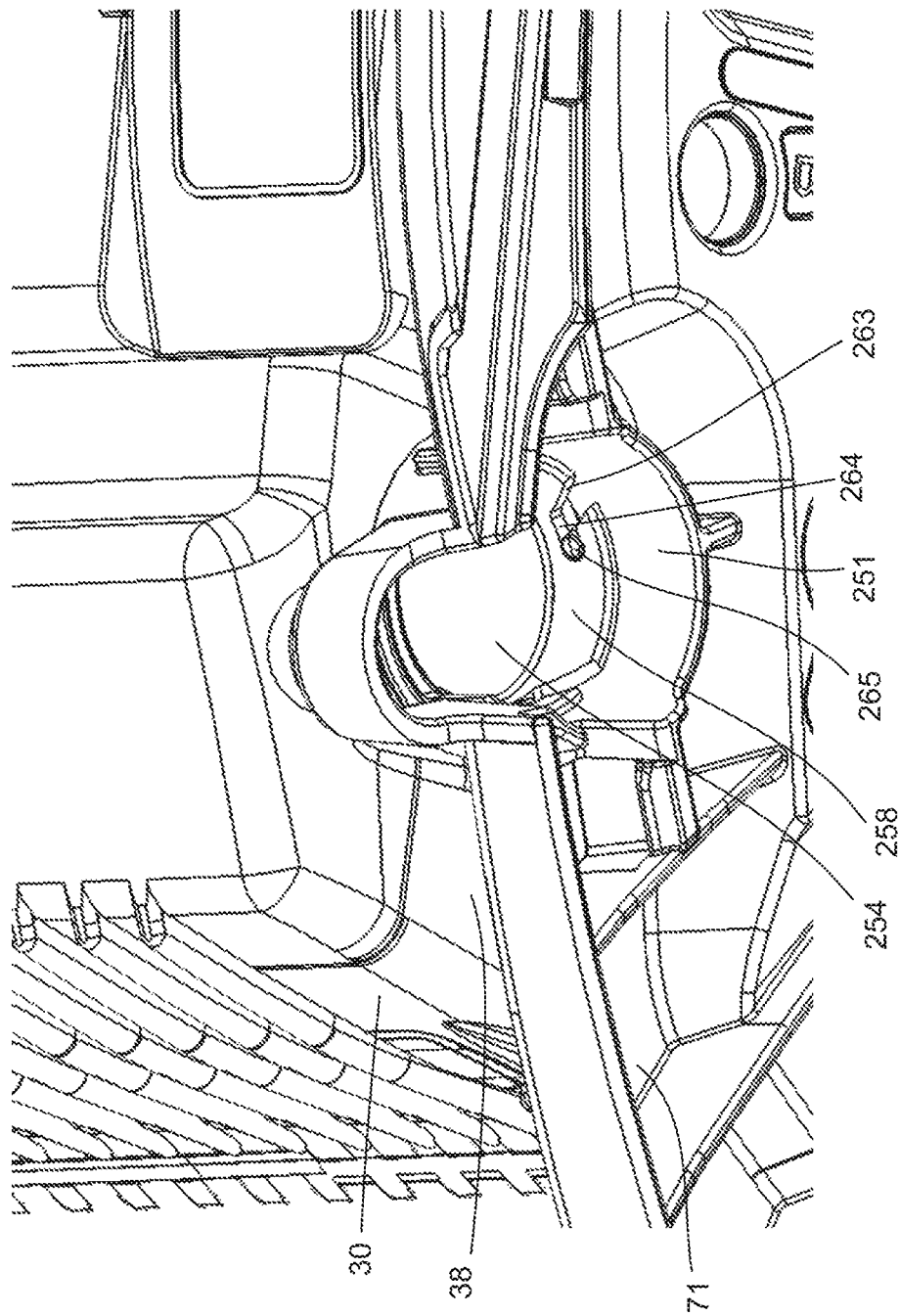
FIG. 11 is a partial bottom perspective view of a substrate container including a conveyor plate mounted to a bottom plate, according to an embodiment of the disclosure.

For example, in FIG. 10 a conveyor plate 71 is placed against the bottom plate 38 of the substrate container 30. The conveyor plate 71 may including mounting inlet 251 which is aligned with mounting inlet 250. A mounting mechanism 254, as depicted in FIG. 11, is received in the mounting inlet 250 and secures the conveyor plate 71 to the bottom plate 38. In one or more embodiments, the mounting mechanism 254 is a portion of material positioned in the bottom plate 38 for securing the conveyor plate 71 to the bottom of the substrate container 30. Depicted in FIGS. 11 and 12, the mounting mechanism 254 is a partial ring having a downwardly extending sidewall 258 and including a plurality of generally L-shaped slots 262 arranged circumferentially in the sidewall 258. In one or more embodiments, the L-shaped slots 262 are ramped having a vertical portion 263 and a horizontal or detent portion 264.

In various embodiments, the conveyor plate 71 may include a plurality of outwardly extending members or cams 265 in mounting inlet 251. Each of the cams 265 may correspond with the L-shaped slots 262 such that the conveyor plate 71 may be secured to the bottom plate 38 by downward insertion of the mounting mechanism 254 into the mounting inlets 250 and 251, receiving cams 265 into the vertical portions 263, and twisting the mounting mechanism 254 to guide the cams 254 upwardly and into the detent portion 264, securing the conveyor plate 71 to the bottom plate 38.

In various embodiments, the sidewall 254 includes a rearward opening 266 corresponding to the offset conduit portion 166. As such, when secured to the bottom plate 38, the offset conduit portion 166 extends rearwardly from the mounting mechanism 254 to reach the inlet nozzle 214.

In certain embodiments, various types of mounting mechanisms 254 may be used to secure the conveyor plate 71 to the bottom plate 38. For example, the mounting mechanism may use ultrasonic or heat welding, snap fits, adhesive bonding, or other suitable techniques. In some embodiments, the mounting mechanism 254 is integral with the bottom plate 38, such that the bottom plate 38 and the mounting mechanism are one continuous piece.

Figure 12:
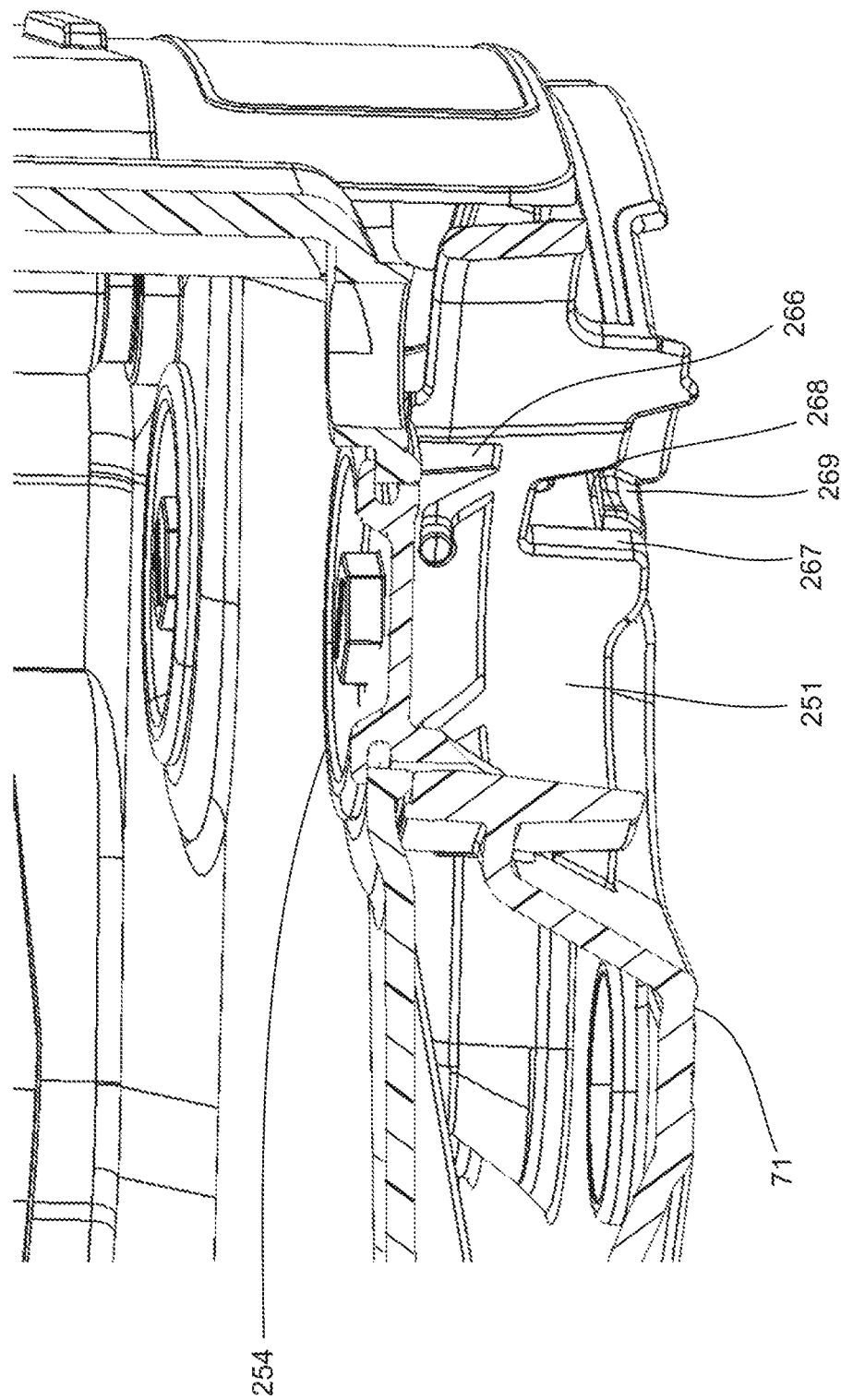
FIG. 12 is a partial cross section view of a substrate container including a conveyor plate mounted to a bottom plate, according to an embodiment of the disclosure.
Figure 13:
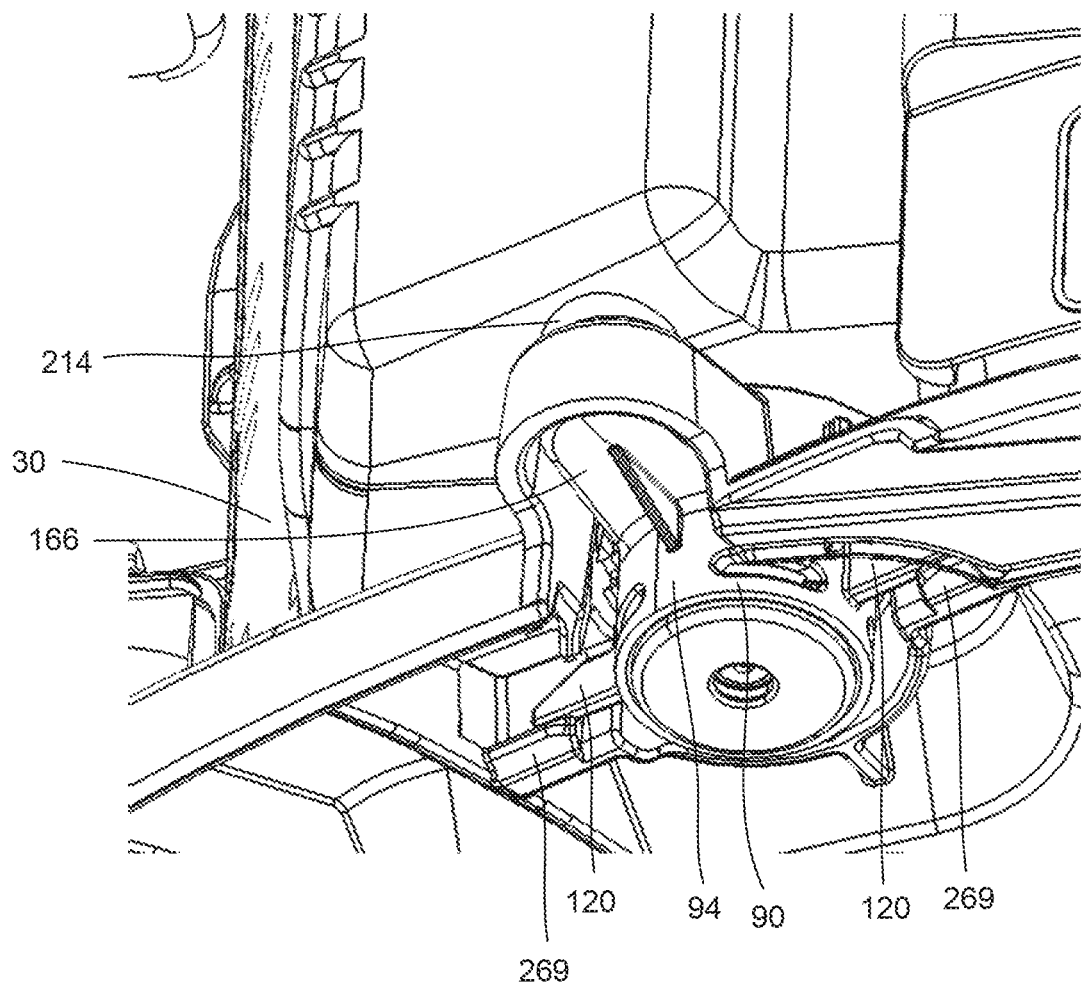
FIG. 13 is a partial bottom perspective view of a substrate container including an externally mounted purge assembly, according to an embodiment of the disclosure.

Depicted in FIGS. 12-13, one or more embodiments, the conveyor plate 71 includes locking features for the purge interface body 90, including one or more lateral openings 267 in the mounting inlet 251 which expose access to a support shelf 268. In various embodiments, the support shelves 268 are defined by undercut portions 269 in the conveyor plate 71. In various embodiments, the purge interface body 90 is secured to substrate container 30 by upwardly inserting the purge interface body 94 into the mounting inlet 251 and the inlet nozzle 142 (FIG. 2-4) into the rearward inlet 214. As the purge interface body 94 is upwardly inserted, the support portions 120 may engage with the sloped or barbed undercut portion 269 and flex until the purge interface body 94 has been fully inserted into the mounting inlet 251. Once inserted, the support portions 120 may "snap" onto the support shelves 268 to lock the purge interface body in place.

Figure 14:
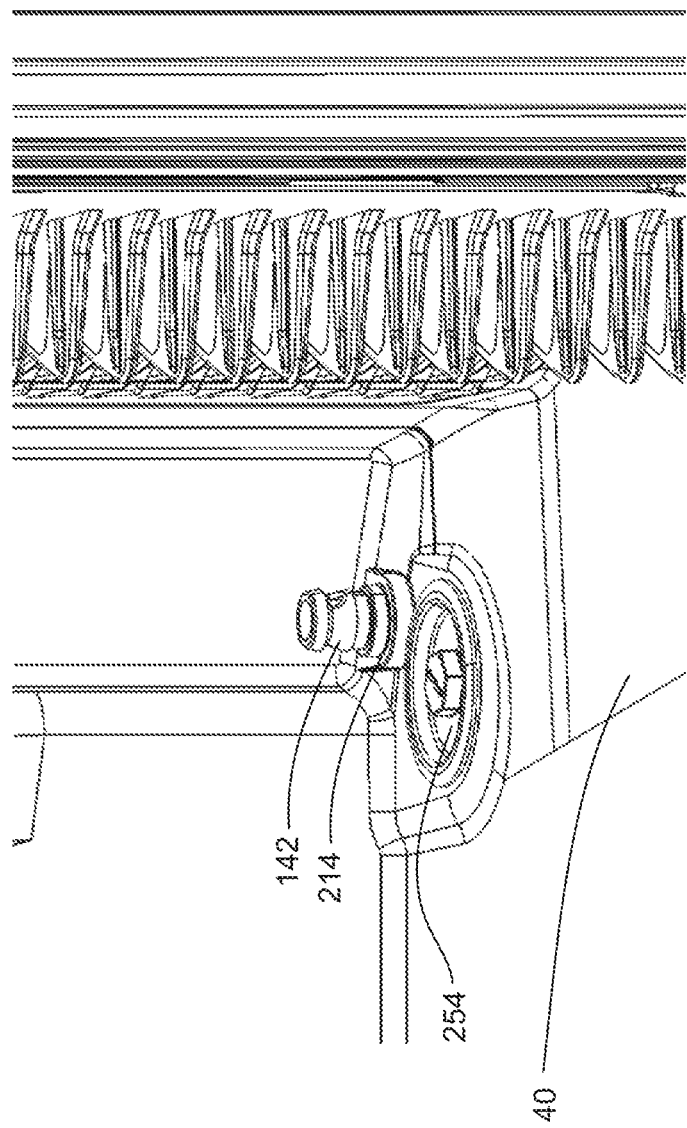
FIG. 14 is a partial perspective view of an interior of a substrate container including an externally mounted purge tower assembly, according to an embodiment of the disclosure.
Figure 15:
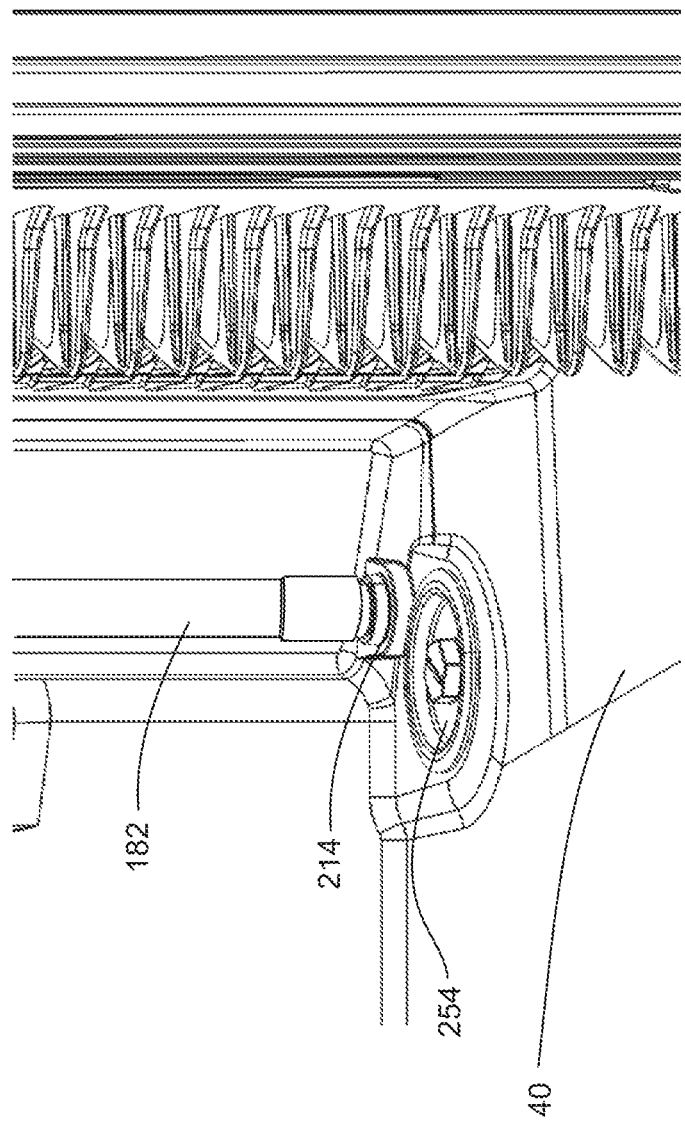
FIG. 15 is a partial perspective view of an interior of a substrate container including an externally mounted purge tower assembly, according to an embodiment of the disclosure.

In FIG. 14, the interior of the substrate container 30 is depicted. In the interior, the rearward inlet 214 and mounting mechanism 254 are depicted in the floor 40 of the substrate container 30. The purge interface body 90 is mounted to the substrate container 30 and the inlet nozzle 142 is depicted inserted through the rearward inlet 214 and extended into the interior of the container 30. In FIG. 15, a diffuser tower 182 is depicted, fitted onto the inlet nozzle 142.

Figure 17:
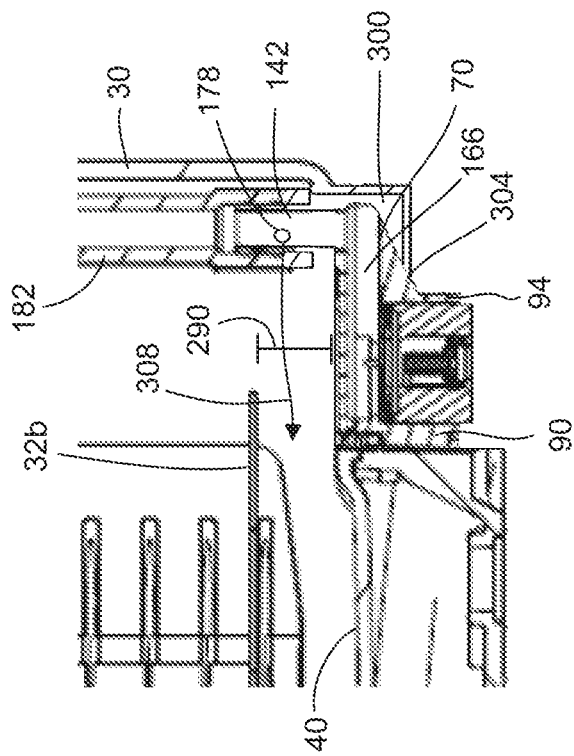
FIG. 17 is a close up cross-sectional view of the purge tower assembly and substrate container taken at line 7-7 of FIG. 6
Figure 16:
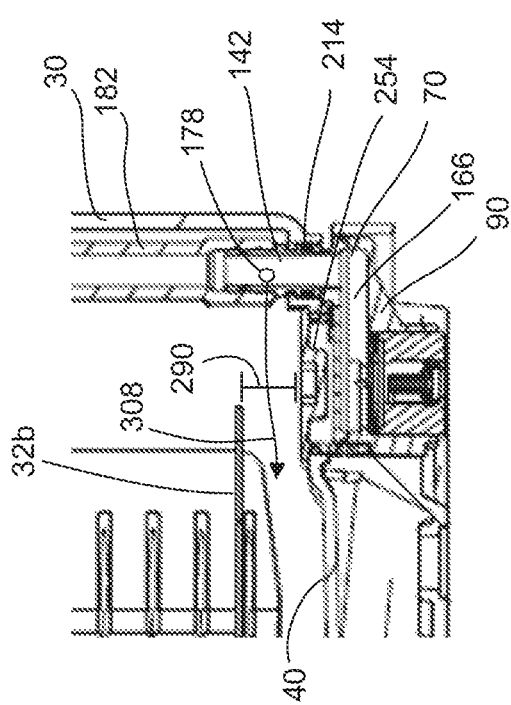
FIG. 16 is a cross-sectional view of a substrate container including a recess with an internally mounted purge tower assembly, according to an embodiment of the disclosure.

Referring to FIGS. 16 and 17, cross-sectional views of a portion of a substrate container 30 and purge tower assembly 70 are depicted according to embodiments of the disclosure. In FIG. 15, the purge interface body 90 is mounted externally on the bottom plate 38, as described above. The mounting mechanism 254 is positioned in the floor 40 and secures the purge interface body 90 to the container 30. The inlet nozzle 142 enters into the interior of the container 30 through the rearward inlet 214. A diffuser portion 182 for diffusion of purge gas entering the substrate container 30 through the purge interface body 90 is fitted onto the inlet nozzle 142 such that a portion of the inlet nozzle 142 extends into the interior of the diffuser portion 182. Substrate 32b, positioned in the lowermost slot 68a, extends rearwardly in the container 30 towards the purge tower assembly 70. Because the purge interface body 90 is mounted externally, a clearance 290 is maintained between the lowermost substrate 32b and the floor 40 and the mounting mechanism 254 of the container.

In some embodiments, such as depicted in FIG. 16, the substrate container 30 defines a rearward recess 300 in the floor 40. In such embodiments, the purge interface body 90 is mounted internally within in the container 30. For example, the purge interface body 90 may be positioned in the recess 300 with the base portion 94 extending through an aperture 304 for connection to an external fluid source. The recess 300 may be sized so that the uppermost extremity of the purge interface body 90 is at or below the level of the floor 40 of the substrate container 30.

Functionally, the recess 300 of the FIG. 16 embodiment reduces the profile of the offset conduit 166. Because of the reduced profile, the offset conduit 166, though internal to the container 30, provides the same clearance 290 as the external offset conduit arrangement of FIG. 15, and the same operational benefits with respect to end effector manipulation and gas purging.

Also depicted in FIGS. 15 and 16, in one or more embodiments, the inlet nozzle 142 includes a lateral aperture 178, as described above. In various embodiments, the inlet nozzle 142 and the lateral aperture 178 are configured so that the diffuser portion 182 of the purge tower assembly 70 may be active at or near the floor 40 of the substrate container. For example, in some embodiments, the lateral aperture 178 is positioned at a height on the on the inlet nozzle 142 that corresponds with the floor 40 of the substrate container 30.

In operation, for both the embodiments of FIGS. 15 and 16, the clearance 290 provides maneuvering space beneath the substrate 32b for robotic end effectors (not depicted), with little or no interference from the components of the purge interface body 90. Also, having the base of the diffuser portion 182 at floor level, in combination with the clearance 290 provided by the external or the reduced profile offset conduit 166, enables purge gas to enter the substrate container 30 at floor level so that purge flow 308 is directed beneath the lowermost substrate 32b.

Each of the additional figures and methods disclosed herein can be used separately, or in conjunction with other features and methods, to provide improved devices and methods for making and using the same. Therefore, combinations of features and methods disclosed herein may not be necessary to practice the disclosure in its broadest sense and are instead disclosed merely to particularly describe representative and preferred embodiments.

Various modifications to the embodiments may be apparent to one of skill in the art upon reading this disclosure. For example, persons of ordinary skill in the relevant art will recognize that the various features described for the different embodiments can be suitably combined, un-combined, and re-combined with other features, alone, or in different combinations. Likewise, the various features described above should all be regarded as example embodiments, rather than limitations to the scope or spirit of the disclosure.

Persons of ordinary skill in the relevant arts will recognize that various embodiments can comprise fewer features than illustrated in any individual embodiment described above. The embodiments described herein are not meant to be an exhaustive presentation of the ways in which the various features may be combined. Accordingly, the embodiments are not mutually exclusive combinations of features; rather, the claims can comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

References to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of 35 U.S.C. 112(f) are not to be invoked unless the specific terms "means for" or "step for" are recited in the respective claim.

What is claimed is:

1. A purge tower assembly for a substrate container, the purge tower assembly comprising:
    a purge interface body for insertion into an inlet of a bottom plate of a substrate container, the purge interface body including:
    a base portion having a substantially tubular base sidewall extending upwardly from a bottom edge to a top edge, the bottom edge defining a first aperture for access to an interior of the base portion, the first aperture being concentric about a first axis, and support portions extending outwardly from the tubular base sidewall for engaging with locking features of the inlet when the purge interface body is inserted into the inlet; and
    a top portion connected to the base portion, the top portion including a top sidewall positioned on the top edge of the base portion, the top portion including an inlet nozzle configured for mounting through an inlet in the bottom plate of the substrate container, the inlet nozzle having a substantially tubular nozzle sidewall extending upwardly from the top sidewall to a nozzle edge, the nozzle edge defining a second aperture for access to an interior of the inlet nozzle, the second aperture concentric about a second axis substantially parallel to and positioned rearward of the first axis, wherein the top sidewall cooperates with the base portion to define an offset conduit portion disposed between the first aperture and the inlet nozzle, the base portion and the inlet nozzle in fluid communication via the offset conduit portion.

2. The purge tower assembly of claim 1, further comprising:
    a diffuser portion defining a diffuser passageway that extends into the diffuser portion along a diffuser axis, the diffuser passageway defining an opening at a bottom portion of the diffuser portion operatively coupled to the inlet nozzle for fluid communication between the base portion, the inlet nozzle, and the diffuser portion.

3. The purge tower assembly of claim 2, wherein the nozzle sidewall includes external threads formed on an external surface of the nozzle sidewall.

4. The purge tower assembly of claim 3, wherein the diffuser portion includes internal threads formed on an internal surface of the diffuser portion, the internal threads compatible with the external threads of the inlet nozzle for operative coupling between the diffuser portion and the inlet nozzle.

5. The purge tower assembly of claim 2, wherein the diffuser portion includes a widened portion at the bottom portion.

6. The purge tower assembly of claim 2, wherein the diffuser portion includes a porous diffuser sidewall.

7. The purge tower assembly of claim 1, wherein the base portion includes a grommet and a valve mounted in the first aperture for fluid communication with an external fluid source.

8. The purge tower assembly of claim 1, wherein the inlet nozzle is a barbed nozzle including a barbed portion and a tapered portion, the barbed portion defining an outer diameter of the barbed nozzle, the tapered portion defining a reduced outer diameter adjacent the barbed portion.

9. The purge tower assembly of claim 8, wherein the nozzle sidewall defines a lateral aperture between the barbed portion and the tapered portion.

10. The purge tower assembly of claim 1, wherein the inlet nozzle is sized such that, when mounted to the bottom plate of the substrate container, the inlet nozzle extends upwardly to about a position of a first wafer contained within the substrate container.

11. The purge tower assembly of claim 1, wherein the top sidewall is substantially planar.

12. A substrate container for containing substrates, the substrate container comprising:
  a container portion including two opposing sidewalls, a back sidewall, a top sidewall, and a bottom plate including a rearward inlet, the container portion defining an opening in a front portion of the substrate container for insertion and removal of substrates, the container portion mounted on a conveyor plate;
  a door configured for covering and sealing the opening defined by the container portion;
  a mounting inlet defined in the conveyer plate, the mounting inlet including locking features:
  a purge interface body received in the mounting inlet, the purge interface body including:
  support portions engaged with the locking features of the mounting inlet;
  a base portion having a substantially tubular base sidewall extending upwardly from a bottom edge to a top edge, the bottom edge defining a first aperture for access to an interior of the base portion, the first aperture concentric about a first axis;
  a top portion connected to the base portion, the top portion having a substantially planar top sidewall positioned on the top edge of the base portion for upwardly covering the bottom aperture, the top portion including an inlet nozzle, the inlet nozzle inserted through the rearward inlet in the bottom plate of the substrate container, the inlet nozzle having a substantially tubular nozzle sidewall extending upwardly from the top sidewall to a nozzle edge, the nozzle edge defining a second aperture for access to an interior of the inlet nozzle, the second aperture concentric about a second axis substantially parallel to and positioned rearward of the first axis; and
  an offset conduit portion disposed between the base portion and the inlet nozzle, the base portion and the inlet nozzle in fluid communication via the offset conduit portion.

13. The substrate container of claim 12, further comprising a diffuser portion having a diffuser passageway that extends into the diffuser portion along a diffuser axis, the diffuser passageway defining an opening at a bottom portion of the diffuser portion operatively coupled to the inlet nozzle for fluid communication between the base portion, the inlet nozzle, and the diffuser portion.

14. The substrate container of claim 13, wherein the nozzle sidewall includes external threads formed on an external surface of the nozzle sidewall.

15. The substrate container of claim 14, wherein the diffuser portion includes internal threads formed on an internal surface of the diffuser portion, the internal threads compatible with the external threads of the inlet nozzle for operative coupling between the inlet nozzle and the diffuser portion.

16. The substrate container of claim 13, wherein the diffuser portion includes a widened portion at the bottom portion of the diffuser portion.

17. The substrate container of claim 12, wherein the base portion includes a grommet and a valve mounted in the first aperture for fluid communication with an external fluid source.

18. The substrate container of claim 12, wherein the inlet nozzle is a barbed nozzle including a barbed portion and a tapered portion of the tubular nozzle sidewall, the barbed portion defining an outer diameter of the barbed nozzle, the tapered portion defining a reduced outer diameter adjacent the barbed portion.

19. The substrate container of claim 18, wherein the nozzle sidewall defines a lateral aperture between the barbed portion and the tapered portion.

20. The substrate container of claim 12, wherein the inlet nozzle is sized such that, when connected to the bottom plate and the conveyor plate of the substrate container, the inlet nozzle extends upwardly to about a position of a first wafer contained within the substrate container.

* * * * *